(12) United States Patent
Sundarrajan et al.

(10) Patent No.: US 6,458,251 B1
(45) Date of Patent: Oct. 1, 2002

(54) PRESSURE MODULATION METHOD TO OBTAIN IMPROVED STEP COVERAGE OF SEED LAYER

(75) Inventors: Arvind Sundarrajan, Santa Clara; Darryl Angelo, Sunnyvale; Peijun Ding, San Jose; Barry Chin, Saratoga; Imran Hasim, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/440,679

(22) Filed: Nov. 16, 1999

(51) Int. Cl.$^7$ ............................................. C23C 14/32
(52) U.S. Cl. ..................... 204/192.12; 204/192.15; 204/192.13; 204/298.06; 204/298.07
(58) Field of Search ................. 204/192.12–192.15, 204/298.06–298.07

(56) References Cited

U.S. PATENT DOCUMENTS

| | | | | |
|---|---|---|---|---|
| 5,049,251 A | * | 9/1991 | Inoue | 204/192.12 |
| 5,108,569 A | * | 4/1992 | Gilboa et al. | 204/192.13 |
| 5,171,412 A | * | 12/1992 | Talieh et al. | 204/192.15 |
| 5,178,739 A | * | 1/1993 | Barnes et al. | 204/298.06 |
| 5,431,799 A | * | 7/1995 | Mosely et al. | 204/298.06 |
| 5,439,574 A | * | 8/1995 | Kobayashi et al. | 204/192.15 |
| 5,639,357 A | * | 6/1997 | Xu | 204/192.12 |
| 5,830,330 A | * | 11/1998 | Lantsman | 204/192.12 |
| 5,985,103 A | * | 11/1999 | Givens et al. | 204/192.12 |
| 6,080,285 A | * | 6/2000 | Liu et al. | 204/192.15 |

\* cited by examiner

Primary Examiner—Mark F. Huff
Assistant Examiner—Daborah Chacko-Davis
(74) Attorney, Agent, or Firm—Moser, Patterson & Sheridan LLP

(57) ABSTRACT

A multi-step process for the deposition of a material into high aspect ratio features on a substrate surface is provided. The process involves depositing a material on the substrate at a first pressure for a first period of time and then depositing the material on the substrate at a second pressure for a second period of time. Modulation of the pressure influences the ionization and trajectory of the particles, which are ionized in a plasma environment. The method of the invention in one aspect allows for optimum deposition at the bottom of a high aspect ratio feature during a high pressure step and increased deposition on the sidewalls of the feature during at least a low pressure step.

52 Claims, 4 Drawing Sheets

PRESSURE MODULATION METHOD TO OBTAIN IMPROVED STEP COVERAGE OF SEED LAYER

BACKGROUND OF THE INVENTION

1. Field of the Invention

The present invention provides a method to enhance step coverage of a metal film deposited into high aspect ratio features formed on a substrate.

2. Background of the Related Art

Physical vapor deposition (PVD) or sputtering is a known technique used in the manufacture of integrated circuits. Sputtering is a method by which material on a target are displaced to a desired surface of a substrate where they form a thin film. In a typical PVD process the target and the substrate to be coated are placed in a vacuum chamber which is evacuated to and maintained at a pressure of less than about 10 milliTorr. An inert gas, such as argon, is supplied to the vacuum chamber and a pumping system maintains the desired gas pressure in the chamber. A glow discharge plasma is created in the chamber by supplying a negative DC or RF potential to a cathode (typically the target) and grounding the chamber walls and an anode (typically the substrate). The glow discharge plasma is created in the space between the cathode and the anode, and is generally separated from the electrodes by a dark space or plasma sheath. In a standard PVD chamber, a dense plasma exists near the target. This plasma is maintained by secondary electrons emitted from the target during the sputtering process. Using a magnetron assembly the secondary electrons are trapped by magnetic fields to efficiently create a plasma adjacent the target. In this arrangement, an electric field is produced that is substantially perpendicular to the exposed surface of the target. Thus, positive ions from the plasma are accelerated across the dark space onto the exposed surface of the target resulting in sputtering of the target.

The goal in most deposition processes is to deposit a film of uniform thickness across the surface of a substrate, while also providing good fill of lines, interconnects, contacts, vias and other features formed on the substrate. In some applications, a conformal liner, barrier or seed layer may be deposited. For example, in a copper fill process a barrier layer is deposited on a feature formed in a substrate to prevent diffusion of copper into the base material of the substrate. Subsequently, a conformal seed layer is deposited over the barrier layer and copper is deposited to fill the feature. As device geometries shrink, it has become increasingly difficult to deposit materials conformally into small features to form barrier and seed layers in these features.

With recent decreases in the size of semiconductor devices and corresponding decreases in device features to less than a quarter micron (<0.25 $\mu$m) in aperture width, conventional sputtering (i.e., PVD) has been sheared through the use of a high density plasma (HDP) PVD process, known, for example, as ionized metal plasma (IMP) PVD. IMP-PVD uses a coil disposed between a sputtering target and a substrate to ionize atoms sputtered from the target. As the ionized metal atoms approach the plasma boundary near the substrate, the electric field caused by an applied bias on the substrate directs the ionized metal atoms in a direction generally perpendicular to the substrate surface. These ions are accelerated perpendicularly towards the surface of the substrate within the plasma sheath, improving the selective or preferential filling of high aspect ratio features, e.g., sub-quarter micron. Biasing of the substrate relative to plasma potential is widely used in HDP-PVD to control the energy of ions reaching the substrate and improve directivity. Because the ionized metal atoms are traveling normal to the surface of the substrate, they can deposit into the bottom of high aspect ratio features without hitting the sidewalls of the features and forming overhangs at the top corners of the features.

One of the problems with HDP-PVD is due to the relatively large difference in molar mass between the target material and the plasma gas. For example, the molar mass ratio of Copper to Argon is about 1.59. Because of this difference, target atoms cannot be readily ionized in the HDP-PVD chamber. In an attempt to increase ionization of the sputtered metal particles, it has been suggested to increase the chamber pressure, thereby increasing the plasma density. The higher density, in turn, reduces the mean free path between particles resulting in more collisions and increased ionization. However, the deposition results are compromised once the pressure reaches an upper limit.

Another problem with HDP-PVD is the inability to achieve conformal coverage in the increasingly smaller device features. Conformal coverage of the bottoms and sidewalls of the features is needed to optimize subsequent processes such as electroplating. Electroplating requires conformal barrier layers and conformal seed layers within the device features in order to ensure uniform filling of the feature. While conventional HDP-PVD processes achieve good bottom coverage due to the directionality of the ions provided by the bias on the substrate, the sidewall coverage is not as good. This result is caused in part by the induced high directionality of ions toward the bottoms of the features with little directionality toward the sidewalls.

Therefore, there is a need for a metal deposition process which provides conformal coverage in high aspect ratio features.

SUMMARY OF THE INVENTION

The present invention generally provides a method for depositing a generally conformal film on a substrate to form barrier layers and/or seed layers. The method includes deposition of a material at a first pressure followed by deposition of the material at a second pressure. In one embodiment, the first pressure is higher than the second pressure. The high pressure step results in relatively more deposition of a material on a feature bottom and the low pressure step results in relatively more deposition of material on the sidewalls of the feature.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical iembodiments of this invention and are therefore not to be considered limiting of its scope, for the invention may admit to other equally effective embodiments.

DETAILED DESCRIPTION OF THE PREFERRED EMBODIMENT

The invention will be described below in reference to an ionized metal plasma (IMP) process that can be carried out using process equipment, such as an Endura™ platform, available from Applied Materials, Inc., located in Santa Clara, Calif. The equipment preferably includes an integrated platform having an HDP-PVD chamber, such as ion metal plasma (IMP) processing chamber, known as an IMP VECTRA™ chamber, available from Applied Material Inc. of Santa Clara, Calif. Although the invention is preferably carried out in an HDP-PVD chamber, any chamber enabling the ionization and deposition of a material on a substrate can be used to advantage. Such chambers include electron cyclotron resonance (ECR) chambers and hollow cathode chambers.

Figure 1:
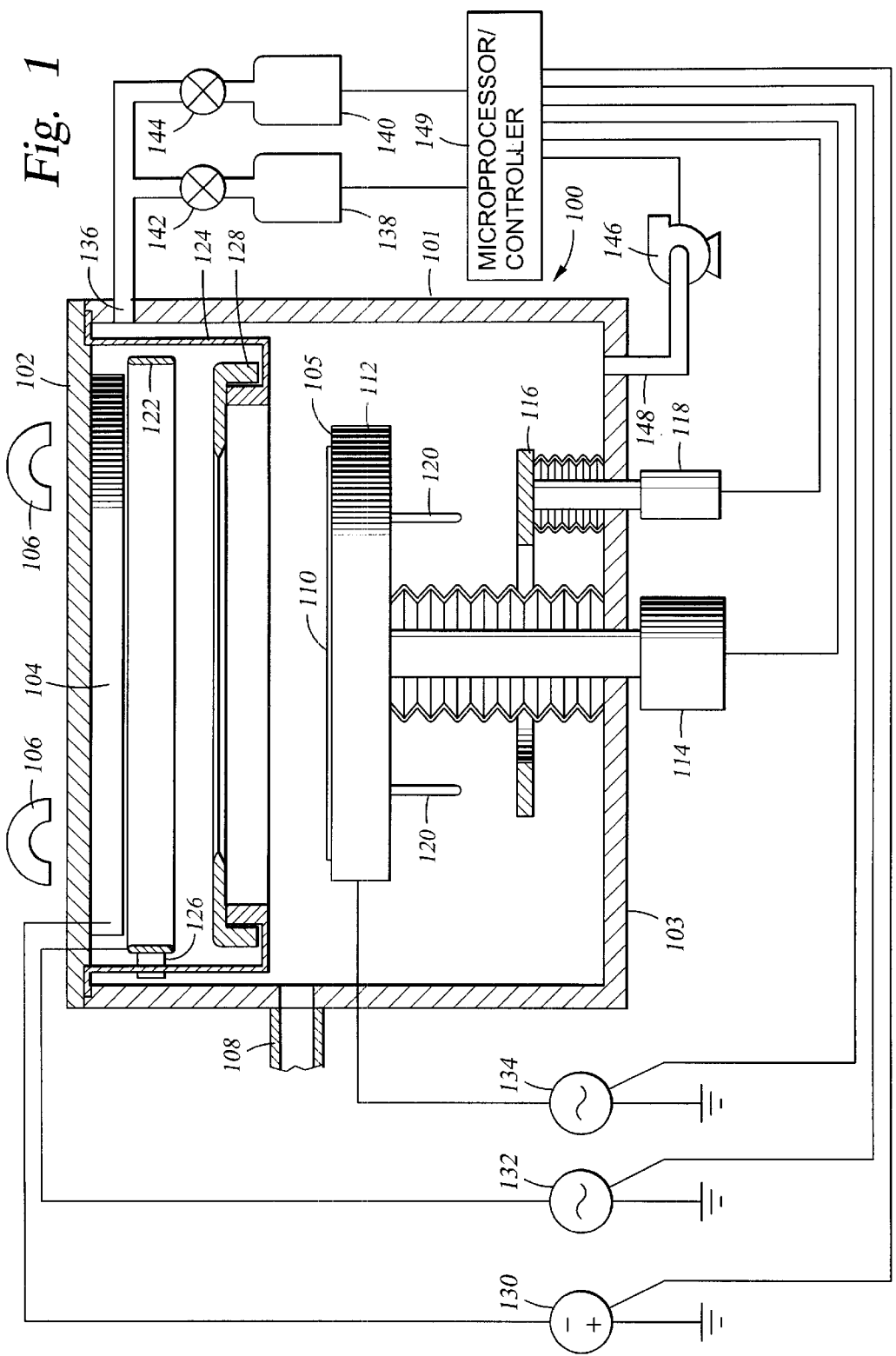
FIG. 1 is a diagram of a typical processing chamber using a coil.

FIG. 1 is a schematic cross-sectional view of an IMP chamber 100 that can be used to advantage with the present invention. The chamber 100 includes sidewalls 101, lid 102, and bottom 103. A target 104 comprising the material to be sputtered is disposed in the chamber 100 on the lid 102. A substrate support member 112 is movably disposed in the chamber 100 and provides an upper support surface 105 for supporting a substrate 110. The support member 112 is mounted on a stem connected to a lift motor 114 that raises and lowers the substrate support 112 between a lowered loading/unloading position and a raised processing position. An opening 108 in the chamber 100 provides access for a robot (not shown) to deliver and retrieve substrates 110 to and from the chamber while the substrate support member is in the lowered loading/unloading position. A lift plate 116 connected to a lift motor 118 is mounted in the chamber 100 and raises and lowers pins 120 mounted in the substrate support. The pins 120 raise and lower the substrate 110 to and from the upper surface 105 of the substrate support member 112. A shield 124 is disposed in the chamber to shield the chamber walls from the sputtered material. A coil 122 is preferably mounted to the shield via supports 126 between the substrate support member 112 and the target 105 and provides electromagnetic fields in the chamber to assist in generating and maintaining a plasma between the target 104 and substrate 110. The electromagnetic fields produced by the coil 122 effect a high density plasma which ionizes the sputtered target material. The ionized material is then directed toward the substrate 110 and deposited thereon. The supports 126 electrically insulate the coil 122 from the shield 124 and the chamber 100. A clamp ring 128 is mounted between the coil 122 and the substrate support 112 and shields an outer edge and backside of the substrate 110 from sputtered materials when the substrate 110 is raised into a processing position to engage the lower portion of the clamp ring 128.

Three power supplies are used in the chamber 100. A first power supply 130 delivers either RF or DC power to the target 104 to cause the processing gas to form a plasma. Magnets 106 disposed behind the lid 102 form a magnetic field at the target surface, which trap electrons and increase the density of the plasma adjacent to the target 104 in order to increase the sputtering efficiency. A second power source 132, preferably a RF power source, supplies electrical power typically in the megahertz range to the coil 122. A third power source 134, preferably a RF or a DC power source, biases the substrate support member 112 with respect to the plasma and provides directional attraction of the ionized sputtered material toward the substrate 110.

One or more plasma gases are supplied to the chamber 100 through a gas inlet 136 from gas sources 138, 140 as metered by respective mass flow controllers 142, 144. One or more vacuum pumps 146 are connected to the chamber 100 at an exhaust port 148 to exhaust the chamber 100 and maintain the desired pressure in the chamber 100. Preferably the vacuum pump 146 is a cryopump or any pump capable of sustaining an acceptable low pressure.

A microprocessor/controller 149 controls the functions of the power supplies, lift motors, mass flow controllers for gas injection, vacuum pump, and other associated chamber components and functions. The microprocessor/controller 149 executes a machine readable program product stored in a memory in order to perform the steps of the invention. In the preferred embodiment the memory is a hard disk drive, and the microprocessor/controller 149 can include analog and digital input/output boards, interface boards and stepper motor controller boards. Optical and/or magnetic sensors are generally used to move and determine the position of movable mechanical assemblies.

In operation, a robot delivers a substrate 110 to the chamber 100 through the opening 108. The pins 120 are extended upward to lift the substrate 110 from the robot. The robot then retracts from the chamber 100 and the opening 108 is sealed. The pins 120 lower the substrate 110 to the upper support surface 105 of the substrate support member 112. The substrate support member 112 raises the substrate 110 to engage the clamp ring 128. One or more plasma gases are then introduced into the chamber 100 to stabilize the chamber 100 at a process pressure. A plasma is generated between the target 104 and the substrate support member 112 with power from the first power source 130. The second power source 132 delivers power to the coil 122 to densify the plasma and ionize the flux of sputtered target material from the target 104 to form ions. The ions are accelerated toward the substrate 110, which is biased by the third power source 134. After deposition, the substrate support member 112 is lowered, the pins 120 are raised to lift the substrate 110, the robot enters the chamber 100 to retrieve the substrate 110, and if desired, delivers another substrate for processing.

A method according to the invention provides a multi-step pressure modulation method which can be performed in chamber 100 to obtain improved step coverage of seed and barrier layers in high aspect ratio features and in particular where aspect ratios are >4:1. The method of the invention can also be used to fill features formed on a substrate. The process generally involves depositing a material on the substrate at a first pressure for a first period of time and then depositing material on the substrate at a second pressure for a second period of time. Modulation of the chamber pressure influences the ionization of the sputtered material and the travel direction of the material that is ionized in a plasma environment.

Figure 2:
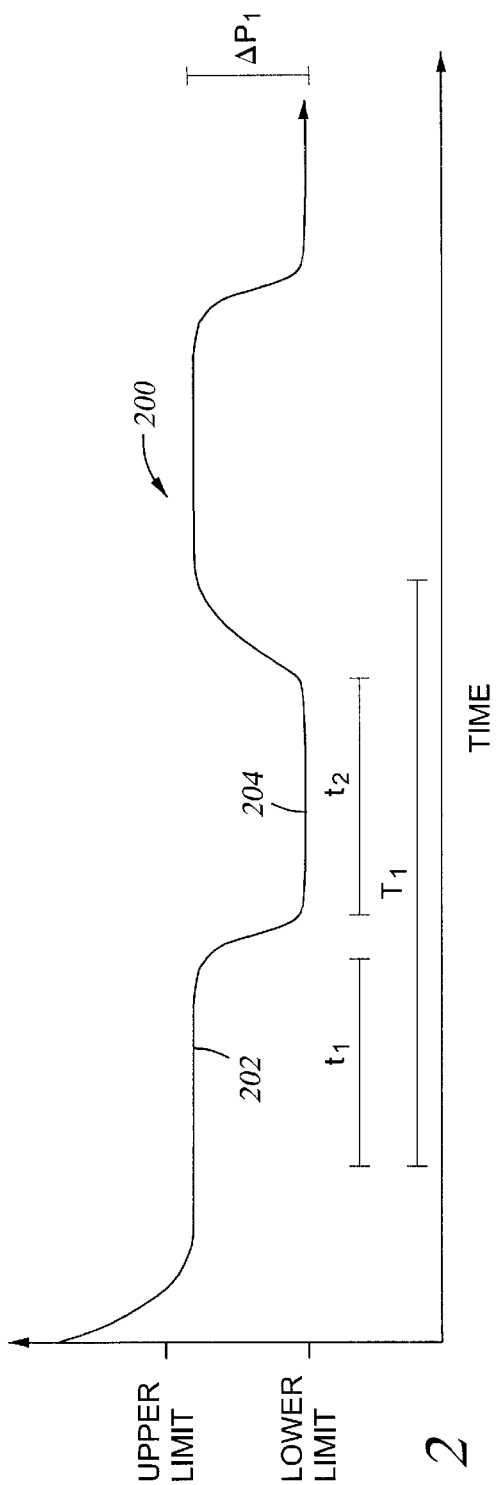
FIG. 2 is a graphical representation of a first embodiment pressure modulation curve.

In one embodiment, the chamber pressure is varied between an upper limit pressure and a lower limit pressure. FIG. 2 is a graphical representation of a pressure modulation curve 200 having a period $T_1$. The pressure modulation curve 200 is preferably oscillated between an upper limit pressure 202 and a lower limit pressure 204, thereby resulting in a pressure differential $\Delta P_1$. For deposition of a liner, barrier or seed layer, the upper pressure 202 is preferably between about 35 mTorr and 70 mTorr, the lower pressure is preferably between about 10 mTorr and 20 mTorr. Thus, $\Delta P_1$ may be between about 15 mTorr and 60 mTorr. The upper limit 202 and the lower limit 204 have independently variable time durations $t_1$ and $t_2$, respectfully. While $t_1$ and $t_2$ vary substantially with particular values for other process parameters including pressure and power, the sum of $t_1$ and $t_2$ is preferably less than about 120 seconds for deposition of liner, barrier or seed layers. Additionally, $t_1$, $t_2$ may be adjusted to compensate for differences in the deposition rate which may result with changes in chamber pressure. For example, a lower deposition rate during $t_1$, as compared to $t_2$, can be compensated for by setting $t_1$ to be greater than $t_2$.

The curve 200 is merely illustrative and whether the modulation sequence is initiated at a lower pressure and then elevated to a higher pressure or vice versa is not limiting of the invention. Further, it is understood that the pressure modulation curve 200 may comprise only a single period $T_1$ for each cycle. Thus, for example, a process recipe may allow deposition of a film on a substrate at the upper limit pressure 202 for a period of time and stabilize the chamber pressure at the lower limit pressure 204 for the duration of the deposition cycle. Preferably, other process parameters such as substrate temperature, target power, etc., are held constant or are adjusted according to recipes known in the art. Regarding the target power, some level of power is applied to the target 104 through the deposition cycle in order to provide constant sputtering and deposition.

Figure 3:
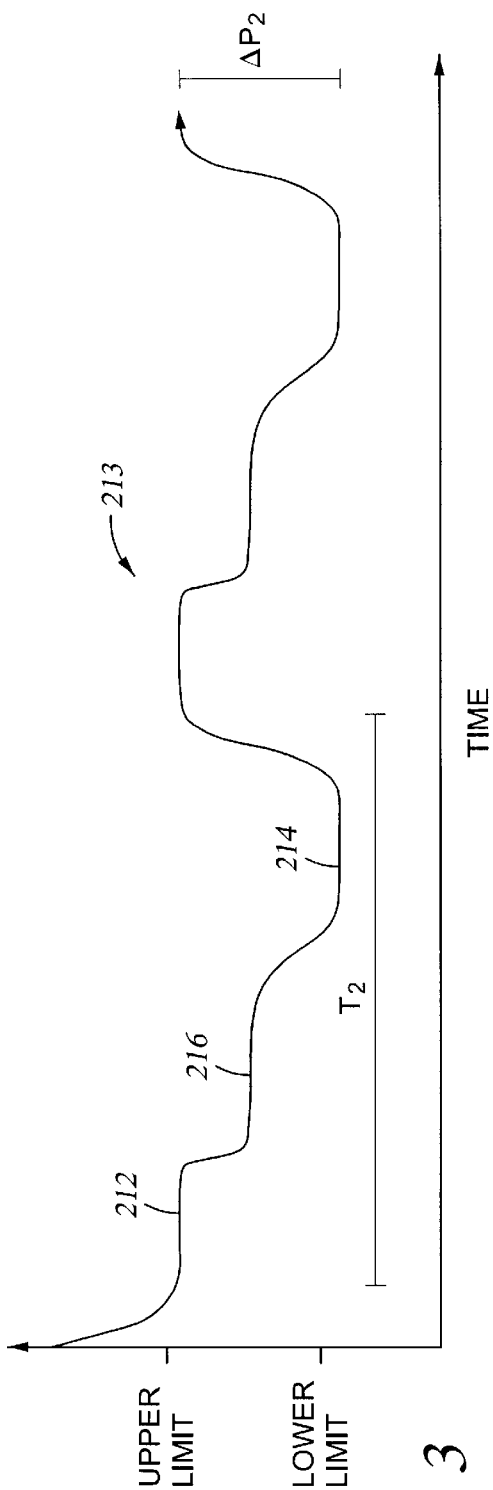
FIG. 3 is a graphical representation of a second embodiment pressure modulation curve.

FIG. 3 illustrates another embodiment of the invention wherein the chamber pressure is varied between more than two pressures. For example, FIG. 3 shows a pressure modulation curve 213 having an upper pressure 212, a lower pressure 214 and an intermediate pressure 216. The pressure difference between the upper limit 212 and the lower limit 214 results in $\Delta P_2$ which may be any quantity as determined by a particular application and is preferably between about 15 mTorr and about 60 mTorr for deposition of a liner, barrier or seed layer. Therefore, in operation the chamber pressure is initially stabilized at the upper limit pressure 212 for a period of time. Subsequently, the chamber pressure is lowered to the intermediate pressure 216 for a period of time. Finally, the chamber pressure is lowered to the lower limit pressure 214 for a period of time. The total period of the curve 213 is $T_2$. Each of the pressures 212, 214 and 216 may be maintained for a desired period of time as determined by a particular application and may be repeated during a single processing cycle at a desired frequency. As in the previous embodiment, power is continually provided to the target 104 to ensure sputtering therefrom throughout the deposition cycle.

The pressure modulation of the invention may be accomplished either by varying the inlet flow of gas from gas sources and/or varying the outlet flow of gas to the vacuum pump downstream from the chamber. For example, with regard to process modulation curve 200 in FIG. 2, a flow rate maintained during $t_1$ can be decreased while the exhaust from the chamber is maintained constant to achieve the lower limit pressure during $t_2$. It is therefore possible to establish a programmable sequence for various modes of pressure modulation during the deposition process. By modulating the pressure, good sidewall and bottom coverage can be obtained. For example, a first pressure provides a relatively higher deposition rate on the bottom of the feature as compared to a second pressure, lower than the first pressure, that provides a relatively higher deposition rate on the sidewalls of the feature.

Figures 4, 5:
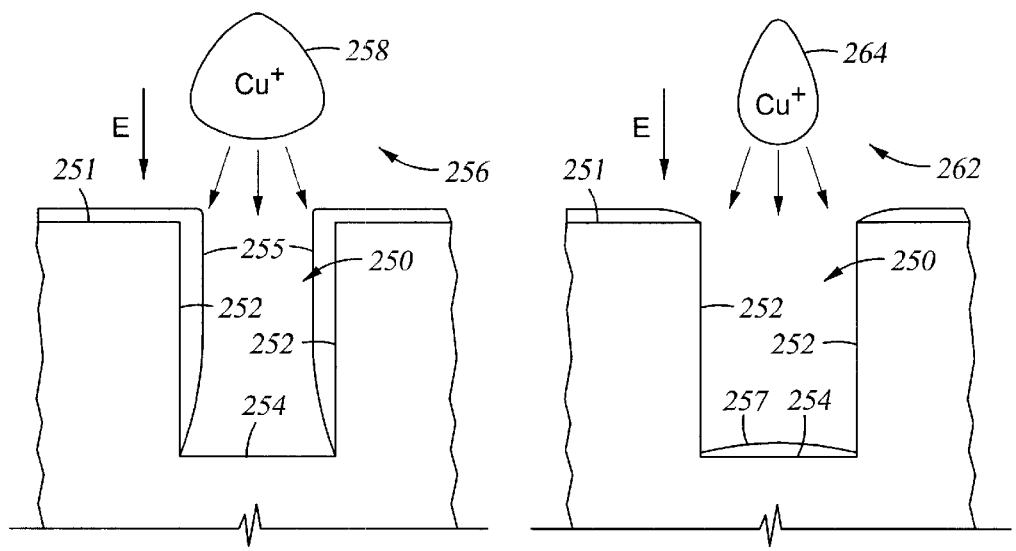
FIG. 4 is a schematic representation of the angular distribution of ions effected by low pressure.
FIG. 5 is schematic representation of the angular distribution of ions effected by high pressure.

The effects of pressure modulation on the angular distribution of ions may be understood with reference to FIGS. 4 and 5 which show a cross-section of a via 250 formed in a substrate 251 having sidewalls 252 and a bottom 254. At a low limit pressure, the angular distribution 256 of incoming ions 258, shown here as Cu ions, results in a greater deposition rate on sidewalls 252 of the via 250 to form a layer 255 thereon as shown in FIG. 4. The angular distribution 256 results because of a decrease in the proportion of ionized sputtered atoms. At lower chamber pressures, the plasma density is decreased, thereby resulting in fewer collisions between the sputtered atoms and the plasma constituents and hence, less ionization of the sputtered atoms. Since the unionized atoms are unaffected by the bias on the substrate, the angular distribution 256 approaches a cosine distribution producing a relatively higher rate of deposition on the sidewalls 252.

During an upper limit pressure the angular distribution 262 of incoming ions 264 is altered to effect a greater deposition rate at the bottom 254 of the via 250, thereby producing a layer 257 on the bottom 254, as shown in FIG. 5. The angular distribution 262 is a result of the increased ionization associated with a relatively higher chamber pressure. Thus, the bias on the substrate directs the ions more normal to the surface of the substrate.

Figures 6A, 6B:
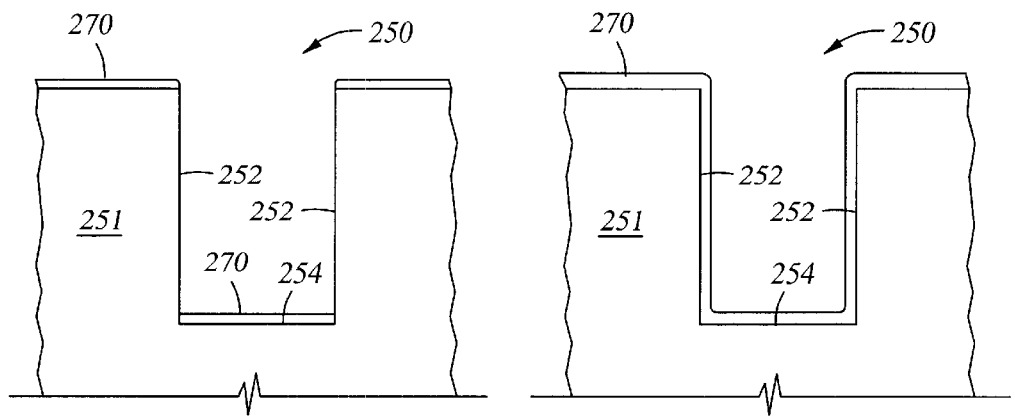
FIGS. 6A–D illustrates the effects of pressure modulation on deposition of a material in a feature.
Figures 6C, 6D:
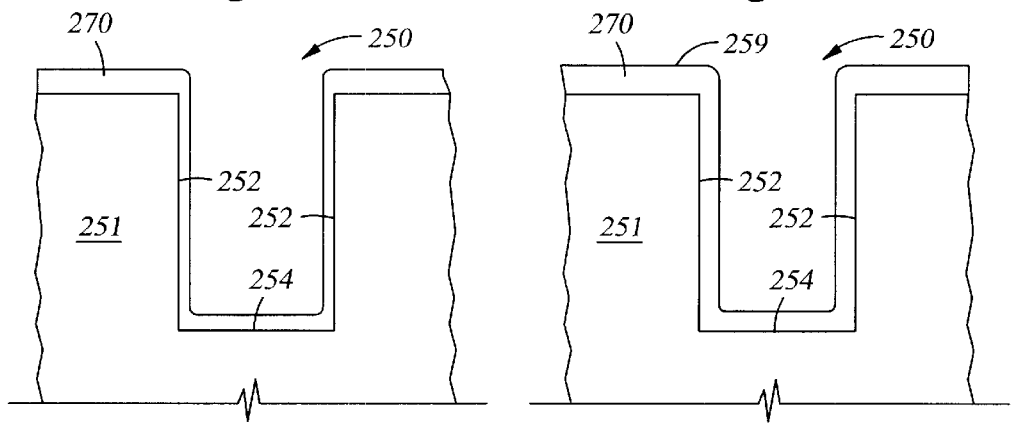

FIGS. 6 A–D show a cross-section of a via 250 having sidewalls 252 and a bottom 254 and illustrate the progressive deposition of a material 270 on a substrate 251 over time using pressure modulation according to the invention. FIGS. 6 A–D are representative of deposition on sidewalls 252 and a bottom 254 during two periods of a curve which oscillates between two pressure limits (such as in FIG. 2) due to the chamber pressure modulation. The pressure modulation effects variable rates of deposition on the sidewalls 252 and at the bottom 254. Initially, a relatively high pressure results in the angular distribution 262 shown in FIG. 5, causing the material 270 to be deposited on the bottom 254 of the via 250 as shown in FIG. 6A. Subsequently, a relatively low pressure results in the angular distribution 256 shown in FIG. 4 causing the material 270 to be deposited on the sidewalls 252 of the via 250 as shown in FIG. 6B. FIG. 6C illustrates the increasing film thickness on the bottom 254 during the subsequent high pressure period. The pressure modulation can be repeated at a desired frequency and with the desired time durations at the higher and lower pressure until a conformal layer 259 of a desired thickness is reached as shown in FIG. 6D.

Accordingly, during a relatively higher chamber pressure the percentage of deposition on the bottom 254 of the via 250 is higher, while during a relatively lower chamber pressure the percentage of deposition on the sidewalls 252 is higher. Thus, by modulating the chamber pressure to vary the angular distribution of ions, the incremental deposition to form thin sub-layers of the final layer thickness may be controlled, thereby resulting in conformal step coverage and void-free deposition.

The invention has utility in any physical vapor deposition process wherein conformal step coverage or uniform filling is needed in the deposition of tungsten (W), titanium (Ti), titanium nitride (TiN), aluminum (Al), copper (Cu) and other materials. One of the essential steps in metallization of copper, for example, is the deposition of a barrier layer and seed layer to a specified thickness on the sidewalls and bottoms of device features, e.g., such as vias, trenches, contacts, etc. A minimal thickness of the barrier layer and seed layer is desired for filling the structures by electroplating, for example. The deposition of a barrier layer and a seed layer in a via as steps of a copper metallization scheme is shown in FIGS. 7–11.

Figure 7:
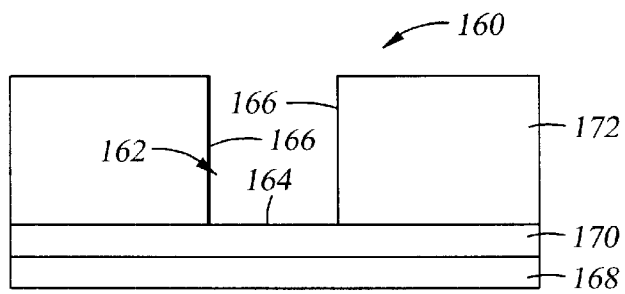
FIG. 7 is a schematic diagram of the semi-conductor substrate formed in a dielectric material.

FIG. 7 is a cross-sectional view of a substrate 160 comprising a silicon base 168, a conducting layer 170, and a dielectric layer 172. A via 162 defined by a bottom 164 and side-walls 166 are formed in the dielectric layer 172. Initially, the substrate 160 is preferably subjected to a cleaning process such as argon bombardment and/or reactive precleaning in a pre-cleaning chamber wherein native oxides or other contaminants on the surface are removed.

Figure 8:
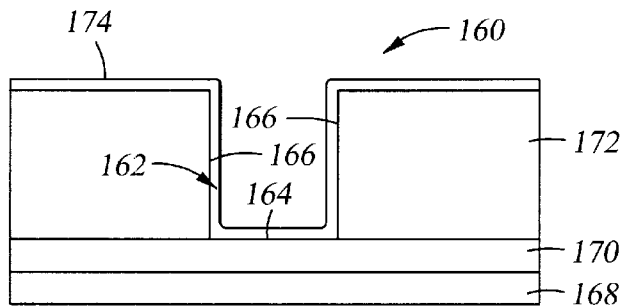
FIG. 8 is a schematic diagram of the semi-conductor substrate via FIG. 7 having a barrier layer formed thereon.

Subsequently, the substrate 160 is moved into an IMP chamber where a barrier layer 174 is conformally deposited over the bottom 164 and sidewalls 166 of the substrate 160, as shown in FIG. 8, to prevent a subsequently deposited seed layer and fill material from diffusing into the underlying dielectric layer 172. The barrier layer 174 is preferably tantalum, tantalum nitride, tungsten, tungsten nitride, titanium nitride or combinations thereof. The target 104 comprises the desired barrier layer material (or at least a portion thereof) to be deposited onto the substrate 160. The barrier layer 174 is preferably deposited to a thickness of about 100 Å to about 450 Å. The substrate support member 112 is heated to a temperature of between about 100° C. and 150° C. A plasma gas is then introduced into the chamber 100 to stabilize the chamber pressure at a first pressure. A medium/high density plasma is struck and maintained by supplying RF power between about 1 kW and about 5 kW to the coil 122. A signal is supplied to the target of about 1 kW and about 4 kW. The resulting negative bias attracts the plasma ions to the target 104 and causes sputtering of the target 104. The sputtered target material is then ionized through collisions with the plasma constituents. A 13.56 MHz signal of between about 0 kW and about 500 kW is applied to the substrate 160 in order to attract the ionized target material to the substrate 160. The pressure is modulated the first pressure of between about 40 mTorr and a second pressure of about 15 mTorr. The first higher pressure is selected to contribute to deposition at the bottom 164 while the second lower pressure is selected to contribute to the sidewalls 166. The modulation may be multi-stepped to form the deposition on the bottom and sidewalls in small increments of film thickness so as to improve the step coverage and uniformity of the substrate layer. Further, the upper and lower pressures may each be maintained for periods of time between about 25–30 seconds and 15 seconds, respectively.

The sequence of the pressure modulation is variable. Thus, the modulation sequence may be initiated at the low pressure and then increased to the higher pressure or, alternatively, the sequence may be initiated at the high pressure and then decreased to the low pressure. However, to avoid the formation of overhangs on the upper corners of the features which can prevent deposition at the bottom of the feature it is preferred that deposition is performed at the higher pressure first and then at the lower pressure. Accordingly, the deposition rate at the bottom of the features is initially higher during the higher pressure step. Subsequently, during the lower chamber pressure, the deposition rate on the sidewalls is relatively higher.

Figure 9:
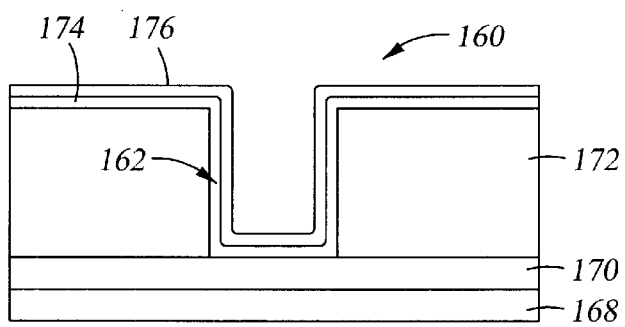
FIG. 9 is a schematic diagram of the semi-conductor substrate via FIG. 8 having a seed layer formed thereon.

Following deposition of the barrier layer 174, as shown in FIG. 9, a seed layer 176 is preferably deposited in the via 162 according to the pressure modulation of the present invention to provide a conformal film which facilitates subsequent filling of the via with a conducting material. In one embodiment, the seed layer 176 comprises copper which is deposited to a thickness of about 100 Å to about 450 Å. A plasma is struck and maintained to cause sputtering of the target 104 in a manner similar to the described above with regard to deposition of the barrier layer. Thus, a plasma gas is then introduced into the chamber 100 to stabilize the chamber pressure at between about 20 mTorr and 60 mTorr. A target bias of about 1 kW to about 5 kW and a coil RF power of about 1 kW to about 5 kW are delivered to the target 104 and coil 122, respectively. A 13.56 MHz bias of about 0–450 W is applied to the substrate 160. Deposition of the seed layer is performed while modulating the pressure between about 45 mTorr and about 15 mTorr.

Preferably, the barrier layer 174 and seed layer 176 are deposited as a continuous process without moving the substrate 160 into an ambient environment between deposition steps, thereby providing good adhesion between the barrier layer 174 and the seed layer 176. In addition, good film texture of the seed layer 176 results. Thus, the substrate 160 is preferably transferred under vacuum conditions to another IMP chamber for seed layer deposition.

Figure 10:
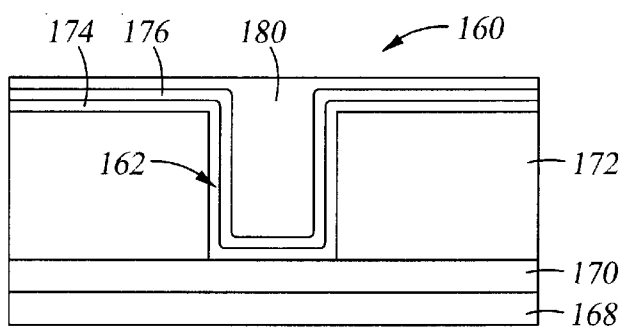
FIG. 10 is a schematic diagram of the semiconductor substrate via FIG. 9 having a conducting material deposition therein to fill the via.
Figure 11:
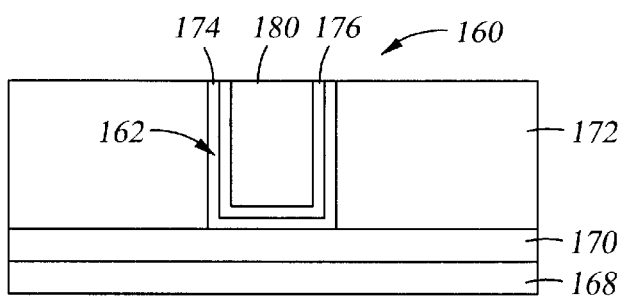
FIG. 11 is a schematic diagram of the semiconductor substrate via of FIG. 10 after planarization.

After depositing a barrier layer and a seed layer, the via 162 is filled with a conductive material 180 as shown in FIG. 10. The conductive material 180 shown is copper and may be deposited according to methods known in the art such as electroplating, chemical vapor deposition and PVD, including the pressure modulation method of the invention. In the case of electroplating, the substrate is preferably placed in a process cell and exposed to an electrolytic solution. A power source is coupled to the conducting seed layer in order to attract ions from the solution. The ions deposit on the seed layer and fill the via 162 as shown in FIG. 10. After the via 162 is filled, the substrate 160 is transferred to a chemical mechanical polishing system or etching system, where the excess material is removed from the substrate 160 and the via 162 is planarized as shown in FIG. 11.

While the foregoing is directed to the preferred embodiment of the present invention, other and further embodiments of the invention may be devised without departing from the basic scope thereof, and the scope thereof is determined by the claims that follow.

What is claimed is:

1. A method for depositing a material on a substrate, comprising:
   (a) providing a plasma in a processing chamber at a first chamber pressure;
   (b) providing a signal to a coil disposed in the processing chamber;
   (c) sputtering the material from a target disposed in the processing chamber;
   (d) maintaining a first chamber pressure for a first period of time and depositing the material onto the substrate at the first chamber pressure;
   (e) modulating the chamber pressure in the processing chamber between at least the first chamber pressure and a second chamber pressure;
   (f) maintaining the second chamber pressure for a second period of time and depositing the material onto the substrate at the second chamber pressure, wherein the first chamber pressure is higher than the second chamber pressure; and (g) repeating (d), (e), and (f) during multiple steps of deposition to form a layer on the substrate.

2. The method of claim 1, wherein the first period of time and the second period of time comprise a total period of time of less than about 120 seconds.

3. The method of claim 1, wherein the first chamber pressure is between about 35 mTorr and about 70 mTorr.

4. The method of claim 1, wherein the second chamber pressure is between about 10 mTorr and about 20 mTorr.

5. The method of claim 1, wherein the first chamber pressure is between about 35 mTorr and about 70 mTorr and the second chamber pressure is between about 10 mTorr and about 20 mTorr.

6. The method of claim 1, wherein the material is selected from the group of copper, tantalum, tantalum nitride, tungsten, tungsten nitride, titanium, titanium nitride, and combinations thereof.

7. The method of claim 1, wherein the first period of time is between about 25 and about 30 seconds.

8. The method of claim 1, wherein the second period of time is about 15 seconds.

9. The method of claim 1, further comprising biasing a substrate support disposed in the processing chamber between about 0 kW and about 500 kW.

10. A method for depositing material in a feature formed on a substrate, comprising:

(a) providing a plasma in a processing chamber;

(b) providing a signal to a coil disposed in the processing chamber;

(c) sputtering a material from a target disposed in the processing chamber; and (d) depositing the material onto the feature while modulating a chamber pressure between a first chamber pressure maintained for a first period of time and a second chamber pressure maintained for a second period of time, wherein the first chamber pressure is higher than the second chamber pressure; and (e) repeating the modulating the chamber pressure between the first chamber pressure maintained for the first period of time and the second chamber pressure maintained for the second period of time to form a layer on the substrate.

11. The method of claim 10, wherein the chamber pressure is modulated between about 10 mTorr and about 70 mTorr.

12. The method of claim 11, wherein the material is selected from the group of copper, tantalum, tantalum nitride, tungsten, tungsten nitride, titanium nitride, and combinations thereof.

13. The method of claim 10, wherein the first period of time is between about 25 and about 30 seconds.

14. The method of claim 10, wherein the second period of time is about 15 seconds.

15. The method of claim 10, further comprising biasing a substrate support disposed in the processing chamber between about 0 kW and about 500 kW.

16. A method for depositing one or more layers in a feature formed on a substrate, comprising:

(a) providing a plasma in a processing chamber having a target and a coil disposed therein;

(b) providing a signal to the target;

(c) providing a signal to the coil;

(d) maintaining a first chamber pressure for a first period of time and depositing a first layer onto the feature;

(e) maintaining a second chamber pressure for a second period of time depositing a second layer onto the feature; and (f) repeating (d) and (e) during multiple steps of deposition of the first layer and the second layer.

17. The method of claim 16, further comprising ionizing at least a portion of the material prior to (d).

18. The method of claim 16, wherein the first and second chamber pressures during (d) and (e) are modulated between about 10 mTorr and about 70 mTorr.

19. The method of claim 16, further comprising filling the feature.

20. The method of claim 16, wherein the first layer and the second layer comprise a material selected from the group of copper, tantalum, tantalum nitride, tungsten, tungsten nitride, titanium nitride, and combinations thereof.

21. The method of claim 16, wherein the first period of time is between about 25 and about 30 seconds.

22. The method of claim 16, wherein the second period of time is about 15 seconds.

23. The method of claim 16, further comprising biasing a substrate support disposed in the processing chamber between about 0 kW and about 500 kW.

24. A program product, which when read and executed by a computer, performs an operation comprising:

providing a signal to a target disposed in a processing chamber;

providing a signal to a coil disposed in the processing chamber;

modulating the chamber pressure between a first chamber pressure maintained for a first period of time and a second chamber pressure maintained for a second period of time during the deposition of a material onto a substrate; and repeating the modulating the chamber pressure between the first chamber pressure maintained for the first period of time and the second chamber pressure maintained for the second period of time to form a layer on the substrate.

25. The program product of claim 24, wherein the chamber pressure is modulated between about 10 mTorr and about 70 mTorr.

26. The program product of claim 24, wherein the chamber pressure is modulated between a first pressure and a second pressure lower than the first pressure.

27. The program product of claim 24, wherein modulating the chamber pressure comprises alternating the chamber pressure between two or more values until a feature on the substrate is filled with material.

28. The program product of claim 24, wherein the first period of time is between about 25 and about 30 seconds.

29. The program product of claim 24, wherein the second period of time is about 15 seconds.

30. The program product of claim 24, wherein the method further comprises biasing a substrate support disposed in the processing chamber between about 0 kW and about 500 kW.

31. A method for depositing one or more layers in a feature formed on a substrate, comprising:

(a) providing a plasma in a processing chamber having a target and a coil disposed therein;

(b) providing a signal to the target;

(c) providing a signal to the coil;

(d) maintaining a first chamber pressure for a first period of time and depositing a first layeronto the feature, wherein the first pressure provides an increased deposition rate on a bottom of the feature; and (e) maintaining a second chamber pressure for a second period of time and depositing a second layer onto the feature at a second chamber pressure maintained for a second period of time, wherein the first chamber pressure is higher than the second chamber pressure, and wherein the first pressure provides an increased deposition rate on a bottom of the feature.

32. The method of claim 31, further comprising ionizing at least a portion of the material prior to (d).

33. The method of claim 31, wherein the first and second chamber pressures during (d) and (e) are modulated between about 10 mTorr and about 70 mTorr.

34. The method of claim 31, further comprising filling the feature.

35. The method of claim 31, wherein the first layer and the second layer comprise a material selected from the group of copper, tantalum, tantalum nitride, tungsten, tungsten nitride, titanium nitride, and combinations thereof.

36. The method of claim 31, further comprising biasing a substrate support disposed in the processing chamber between about 0 kW and about 500 kW.

37. The method of claim 31, further comprising maintaining a third chamber pressure for a third period of time and depositing a third layer onto the feature at a third chamber pressure maintained for a third period of time, wherein the second chamber pressure is higher than the third chamber pressure.

38. A method for depositing material in a feature formed on a substrate, comprising:

(a) providing a plasma in a processing chamber;

(b) providing a signal to a coil disposed in the processing chamber;

(c) sputtering a material from a target disposed in the processing chamber; and (d) depositing the material onto the feature while modulating a chamber pressure between a first chamber pressure maintained for a first period of time and a second chamber pressure maintained for a second period of time, wherein the first chamber pressure is higher than the second chamber pressure and provides an increased deposition rate on a bottom of the feature.

39. The method of claim 38, wherein the first chamber pressure is between about 35 mTorr and about 70 mTorr.

40. The method of claim 38, wherein the second chamber pressure is between about 10 mTorr and about 20 mTorr.

41. The method of claim 38, wherein the first chamber pressure is between about 35 mTorr and about 70 mTorr and the second chamber pressure is between about 10 mTorr and about 20 mTorr.

42. The method of claim 38, wherein the first period of time is between about 25 and about 30 seconds.

43. The method of claim 38, wherein the material is selected from the group of copper, tantalum, tantalum nitride, tungsten, tungsten nitride, titanium nitride and combinations thereof.

44. A program product, which when read and executed by a computer, performs an operation comprising:

providing a signal to a target disposed in a processing chamber;

providing a signal to a coil disposed in the processing chamber; and providing the chamber pressure between a first chamber pressure maintained for a first period of time and a second chamber pressure maintained for a second period of time during the deposition of a material onto a substrate, wherein the first chamber pressure is higher than the second chamber pressure, and wherein the first chamber pressure provides an increased deposition rate on a bottom of the feature.

45. The program product of claim 44, wherein the chamber pressure is modulated between about 10 mTorr and about 70 mTorr.

46. The program product of claim 44, wherein modulating the chamber pressure comprises alternating the pressure between two or more values until a feature on a substrate is filled with material.

47. A method for depositing a material on a substrate, comprising:

(a) providing a plasma in a processing chamber;

(b) providing a signal to a coil disposed in the processing chamber;

(c) sputtering the material from a target disposed in the processing chamber at more than two chamber pressures;

(d) modulating the pressure in the processing chamber between chamber pressures and maintaining each of the chamber pressures for a period of time to deposit the material onto the substrate during each period of time, wherein the chamber pressures comprise a first chamber pressure, a second chamber pressure, and a third chamber pressure, and the first pressure provides an increased deposition rate on a bottom of a feature.

48. The method of claim 47, wherein the two chamber pressures are modulated between about 10 mTorr and about 70 mTorr.

49. The method of claim 47, wherein the chamber pressures are modulated at a pressure difference between about 15 mTorr and about 60 mTorr.

50. The method of claim 47, wherein the material is selected from the group of copper, tantalum, tantalum nitride, tungsten, tungsten nitride, titanium nitride and combinations thereof.

51. The method of claim 47, wherein the first chamber pressure is higher than the second chamber pressure, and the third chamber pressure is lower than the second chamber pressure.

52. The method of claim 51, wherein the third pressure provides an increased deposition rate on sidewalls of the feature.

* * * * *

UNITED STATES PATENT AND TRADEMARK OFFICE
CERTIFICATE OF CORRECTION

PATENT NO.   : 6,458,251 B1
DATED        : October 1, 2002
INVENTOR(S)  : Arvind Sundarrajan et al.

It is certified that error appears in the above-identified patent and that said Letters Patent is hereby corrected as shown below:

Column 2,
Line 58, please change "iembodiments" to -- embodiments --.

Column 3,
Line 25, please change "Endura™" to -- Endura® --.
Line 30, please change "Material" to -- Materials --.

Column 7,
Line 48, please add "between" after "modulated".
Line 50, please add "between" before "about 15".
Line 64, please change "comers" to -- corners --.

Column 10,
Line 65, please change "layeronto" to -- layer onto --.

Signed and Sealed this

Twenty-second Day of April, 2003

JAMES E. ROGAN
*Director of the United States Patent and Trademark Office*